US012787173B2

(12) United States Patent
Moubedi

(10) Patent No.: US 12,787,173 B2
(45) Date of Patent: Nov. 3, 2026

(54) AIR GAPPED DYNAMIC-FLEX CIRCUITS WITH STRIPLINE IMPEDANCE CONTROLS

(71) Applicant: Snap Inc., Santa Monica, CA (US)

(72) Inventor: Shaheen Moubedi, Los Angeles, CA (US)

(73) Assignee: Snap Inc., Santa Monica, CA (US)

( * ) Notice: Subject to any disclaimer, the term of this patent is extended or adjusted under 35 U.S.C. 154(b) by 368 days.

(21) Appl. No.: 18/427,283

(22) Filed: Jan. 30, 2024

(65) Prior Publication Data

US 2025/0247960 A1 Jul. 31, 2025

(51) Int. Cl.
*H05K 1/14* (2006.01)
*H05K 1/02* (2006.01)

(52) U.S. Cl.
CPC ........... *H05K 1/148* (2013.01); *H05K 1/0224* (2013.01); *H05K 1/028* (2013.01); *H05K 1/0298* (2013.01)

(58) Field of Classification Search
CPC .... H05K 1/0218; H05K 1/0224; H05K 1/025; H05K 1/028; H05K 1/0277; H05K 1/0298
See application file for complete search history.

(56) References Cited

U.S. PATENT DOCUMENTS

| | | | | |
|---|---|---|---|---|
| 11,115,074 | B1 * | 9/2021 | Olgun | H01Q 1/273 |
| 11,784,425 | B1 * | 10/2023 | Liao | G06F 1/183 439/495 |
| 12,393,052 | B1 * | 8/2025 | Nikkhoo | G02C 5/22 |
| 2001/0010271 | A1 * | 8/2001 | Lin | H05K 1/0253 174/268 |
| 2013/0175077 | A1 * | 7/2013 | Kim | H05K 1/114 174/262 |
| 2019/0320563 | A1 * | 10/2019 | Shen | B32B 27/065 |
| 2021/0168929 | A1 * | 6/2021 | Wang | H05K 1/028 |
| 2021/0185809 | A1 * | 6/2021 | Park | H05K 1/115 |
| 2022/0200116 | A1 | 6/2022 | Ikemoto | |
| 2023/0282955 | A1 | 9/2023 | Ikemoto | |
| 2023/0292431 | A1 * | 9/2023 | Kirkeby | H05K 3/285 |
| 2024/0373549 | A1 * | 11/2024 | Katsura | H05K 1/0218 |
| 2026/0059648 | A1 * | 2/2026 | Ikemoto | H05K 1/0218 |

OTHER PUBLICATIONS

"International Application Serial No. PCT/US2025/013609, International Search Report mailed Jul. 28, 2025", 6 pgs.
"International Application Serial No. PCT/US2025/013609, Written Opinion mailed Jul. 28, 2025", 14 pgs.

(Continued)

*Primary Examiner* — Timothy J Thompson
*Assistant Examiner* — Amol H Patel
(74) *Attorney, Agent, or Firm* — Schwegman Lundberg & Woessner, P.A.

(57) ABSTRACT

The present disclosure relates to flexible printed circuit boards (FPCBs) for augmented reality (AR) eyewear. Disclosed examples provide an FPCB with air gaps for enhanced bending flexibility and an Electromagnetic Interference (EMI) film for consistent ground reference, enabling high-speed signal transmission with controlled impedance. The FPCB may include asymmetrical dielectric thicknesses and a crosshatch pattern in the ground reference layer to further support signal integrity and mechanical durability.

27 Claims, 6 Drawing Sheets

(56) References Cited

OTHER PUBLICATIONS

"International Application Serial No. PCT/US2025/013609, Invitation to Pay Additional Fees mailed Jun. 6, 2025", 16 pgs.
Amit, Bahl, "Avoiding Common Flexible PCB Errors", Sierra Circuits, [Online]. Retrieved from the Internet: <URL: https://www.protoexpress.com/blog/avoiding-common-flex-pcb-errors/>, (Nov. 25, 2020), 1-18.
Yogendrappa, Milan, "Flex Stack-up with Controlled Impedance", Sierra Circuits, [Online]. Retrieved from the Internet: <URL: https://www.protoexpress.com/blog/howto- build-a-flex-stack-up-with-controlled-impedance/>, (Jun. 16, 2021), 1-21.

* cited by examiner

AIR GAPPED DYNAMIC-FLEX CIRCUITS WITH STRIPLINE IMPEDANCE CONTROLS

TECHNICAL FIELD

This application relates to methods and systems for making and configuring dynamic-flex circuits and, more particularly, to forming and using air gapped dynamic-flex circuits having asymmetric and other stripline impedance controls for augmented reality eyewear.

BACKGROUND

Flexible printed circuit boards (FPCBs) can be integral to many modern electronic devices, especially those requiring components to flex or bend, such as augmented reality (AR) eyewear. In such devices, FPCBs must endure repeated bending at hinge points without failure. Additionally, these circuits must support high-speed electronic signals, which typically necessitates the use of impedance-controlled traces to ensure signal integrity. Traditional FPCB designs face a trade-off between flexibility and the ability to maintain impedance control as the methods to achieve these two objectives are typically at odds with one another.

BRIEF DESCRIPTION OF THE DRAWINGS

In the drawings, which are not necessarily drawn to scale, like numerals may describe similar components in different views. Some nonlimiting examples are illustrated in the figures of the accompanying drawings in which.

DETAILED DESCRIPTION

Figure 1:
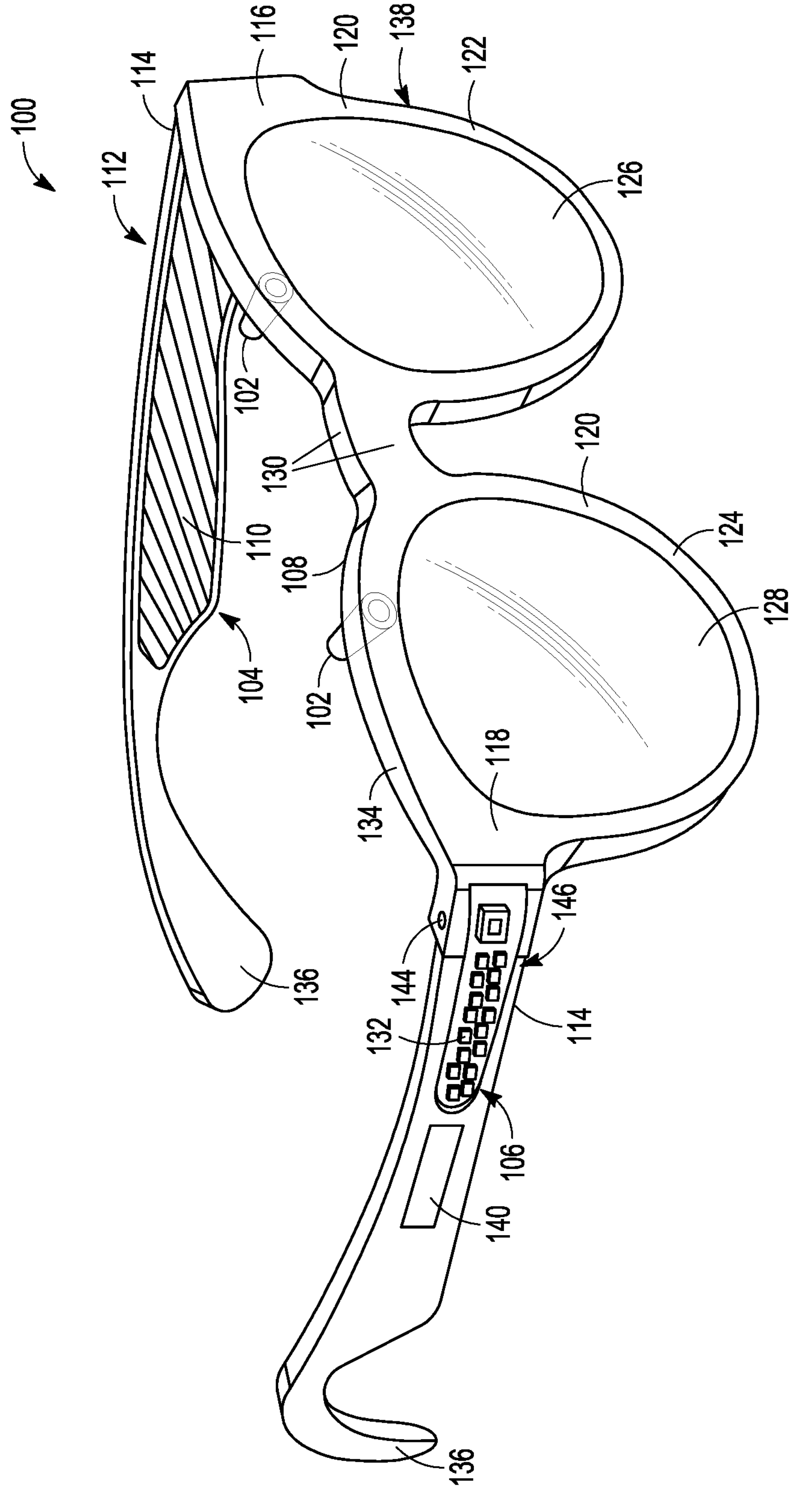
FIG. 1 is a perspective view of a augmented reality (AR) eyewear device, in accordance with an example embodiment.

As mentioned above, FPCBs are integral to many modern electronic devices, especially those requiring components to flex or bend, such as AR eyewear. In such devices, FPCBs must endure repeated bending at hinge points without failure. A high degree of flexibility and "cycle-life" durability can be important at such installations, while supporting high-speed electronic signals that typically necessitate the use of impedance-controlled traces to ensure signal integrity.

Some examples disclosed herein seek to provide an FPCB configuration and manufacturing method that can reconcile these competing requirements to enhance the performance and reliability of AR eyewear and similar devices. Some examples provide both high-bending cycle-life and high-speed signal support while still enabling the use of stripline impedance-controlled traces. Some examples incorporate air gaps for flexibility while maintaining impedance control through strategic design aspects.

Some examples herein include an Electromagnetic Interference (EMI) film to replace a ground reference copper layer. The EMI film provides a consistent ground reference for the stripline traces without compromising dynamic bend performance. An asymmetrical dielectric thickness above and below the stripline traces can help to provide impedance control despite the presence of air gaps. In some examples, a crosshatch pattern in the second ground reference copper layer is provided to improve dynamic flexibility and maintain impedance control. Some examples seek to provide a compact configuration that allows for additional trace and ground reference layers to support various functions, low EMI risk, and high performance in terms of bending cycle-life and bandwidth.

By way of some additional context, a stripline impedance-controlled trace (or "stripline trace") is a type of transmission line used in printed circuit boards (PCBs) and FPCBs to maintain a consistent impedance that can be crucial for high-speed signal integrity. Impedance can be a measure of resistance a circuit offers to the flow of alternating current (AC) and can be important in high-speed circuits to prevent signal reflection and loss, ensuring reliable and efficient data transmission.

A stripline trace is typically sandwiched between two ground reference planes or layers. The trace itself is a conductor that is embedded in a dielectric material, and the entire structure is enclosed within these ground planes. The impedance of the stripline is typically determined by factors such as the width of the trace, the thickness of the dielectric material, and the dielectric constant (relative permittivity) of the material. To achieve a specific impedance, these parameters are carefully calculated and controlled during the design and manufacturing process. High-speed signals travel along the trace, and the surrounding dielectric material and ground planes create a controlled environment that maintains the characteristic impedance. This minimizes signal degradation due to reflections, especially at higher frequencies.

The ground reference layers provide a return path for the signal. In high-frequency circuits, the signal's return path tends to follow the path of least impedance, which ideally is directly beneath the signal trace in the ground plane. The ground planes help to contain the electromagnetic fields associated with the signal within the dielectric material, reducing electromagnetic interference (EMI) and crosstalk with other signals. A consistent ground reference can be essential for maintaining the impedance of the stripline. Variations in the distance to the ground plane or in the dielectric properties can cause impedance mismatches, leading to signal reflections and loss. Ground planes can also help dissipate heat generated by the signal trace, improving the thermal performance of the circuit.

In the context of the present disclosure, one of the many challenges is to maintain the benefits of stripline impedance control while introducing air gaps for flexibility. Air gaps can disrupt the consistent dielectric environment needed for impedance control. Some examples herein seek to address this issue by using an EMI film and asymmetrical dielectric thickness to provide a consistent ground reference on one side of the stripline trace, thereby maintaining impedance control despite the presence of air gaps. Overall benefits may include improved bend cycle life, compactness, signal integrity, power integrity, and manufacturing yields compared to other approaches. These and other aspects are described more fully below.

FIG. 1 shows a perspective view of a head-wearable user device, in this example shown as an AR eyewear device (e.g., the AR glasses 100), in accordance with some example embodiments. The form factor of the AR glasses 100 is compact and space available for internal componentry is tight. The AR glasses 100, in this instance, can be worn to view augmented or virtual content displayed over real content visible in a content interaction system.

The example AR glasses 100 of FIG. 1 include a small frame 112 made from any suitable material such as plastic or metal, including any suitable shape memory alloy, as is known for ophthalmic eyewear. In one or more embodiments, the frame 112 includes a front piece 138, including a first or left (as worn by a user) optical element holder 122 (e.g., a display or lens holder) and a second or right (as worn by a user) optical element holder 124, connected by a nose piece or bridge 130. The front piece 138 additionally includes a left end portion 116 and a right end portion 118. A first or left optical element 126 and a second or right optical element 128 can be provided within respective left optical element holder 122 and right optical element holder 124. Each of the right optical element 128 and the left optical element 126 can be a lens, a display, a display assembly, or a combination of the foregoing. Any of the display assemblies disclosed herein can be provided in the AR glasses 100.

The frame 112 additionally includes a left arm or temple piece 104 and a right arm or temple piece 106 coupled to the respective left end portion 116 and the right end portion 118 of the front piece 138 by any suitable means such as at a folding hinge 144 (one folding hinge 144 on each side), so as to be coupled to the front piece 138, or rigidly or otherwise secured to the front piece 138 so as to be integral with the front piece 138. In one or more implementations, each of the temple pieces 104 and 106 includes a first portion 114 that is coupled to the respective left end portion 116 and right end portion 118 of the front piece 138 and any suitable second portion 136 for coupling to the ear of the user. In one or more embodiments, the front piece 138 can be formed from a single piece of material, so as to have a unitary or integral construction.

The AR glasses 100 can include a computing device, such as a computer 132, which can be of any suitable type so as to be carried by the frame 112 and, in one or more embodiments of a suitable size and shape, so as to be at least partially disposed in one of the temple pieces 104 and the temple pieces 106. In one or more embodiments, as illustrated in FIG. 1, the computer 132 is sized and shaped similar to the size and shape of one of the temple pieces 106 (e.g., or the temple piece 104), and is thus disposed almost entirely, if not entirely, within the structure and confines of such temple piece 106. In one or more embodiments, the computer 132 is disposed in both of the temple piece 104 and the temple piece 106 and flexible circuits connecting the two parts of the computer 132 pass through one (or typically both) of the folding hinges 144. The computer 132 can include one or more printed circuit boards (PCBs) and one or more hardware processors with memory, wireless communication circuitry, and a power source. In some examples, the computer 132 comprises low-power circuitry, high-speed circuitry, and a display processor. Various other embodiments may include these elements in different configurations or integrated together in different ways.

The computer 132 additionally includes a battery 110 or other suitable portable power supply. In one embodiment, the battery 110 is disposed in one of the temple pieces 104 or the temple piece 106. In the AR glasses 100 shown in FIG. 1, the battery 110 is shown as being disposed in left temple piece 104 and electrically coupled using the connection 134 to the remainder of the computer 132 disposed in the right temple piece 106. The AR glasses 100 can include a connector or port (not shown) suitable for charging the battery 110 accessible from the outside of frame 112, a wireless receiver, transmitter, or transceiver (not shown) or a combination of such devices.

In one or more implementations, the AR glasses 100 include cameras 102. Although two cameras 102 are depicted, other embodiments contemplate the use of a single or additional (i.e., more than two) cameras. In one or more embodiments, the AR glasses 100 include any number of input sensors or peripheral devices in addition to the cameras 102. The front piece 138 is provided with an outward facing, forward-facing, or front or outer surface 120 that faces forward or away from the user when the AR glasses 100 are mounted on the face of the user, and an opposite inward-facing, rearward-facing, or rear or inner surface 108 that faces the face of the user when the AR glasses 100 are mounted on the face of the user. Such sensors can include inwardly-facing video sensors or digital imaging modules, such as cameras that can be mounted on or provided within the inner surface 108 of the front piece 138 or elsewhere on the frame 112 so as to be facing the user, and outwardly-facing video sensors or digital imaging modules such as the cameras 102 that can be mounted on or provided with the outer surface 120 of the front piece 138 or elsewhere on the frame 112 so as to be facing away from the user. Such sensors, peripheral devices or peripherals can additionally include biometric sensors, location sensors, or any other such sensors. In one or more implementations, the AR glasses 100 include a track pad 140 or other touch or sensory input device to receive navigational commands from the user. One or more track pads 140 may be provided at convenient locations for user interaction on one or both sides of the temple piece 104 and/or the temple piece 106.

In some examples, a PCB of the computer 132 includes a flexible section or hinge region 146. In some examples, the hinge region 146 is located at or adjacent to the folding hinge 144. More specifically, the hinge region 146 may be located in a region either side of or crossing the or each folding hinge 144. The hinge region 146 adjacent a folding hinge 144 may undergo a significant degree of bending, flexing, or movement when the arms or temple pieces 104 and 106 of the AR glasses 100 are opened and closed, for example.

Integrating high complexity components like application processors, communication modules, and memory into such a flexible section (e.g., hinge region 146) poses challenges when requiring dynamic flexing on the same PCB. These components typically have high pin counts (>100) and fine pitch interconnects (<0.4 mm) which can require fabrication processes not suitable for dynamic flexing areas. For example, they may require thicker copper, specialized dielectric materials, complex via structures, and plating techniques that reduce flex reliability and durability. When high complexity components are integrated on rigid-flex PCBs requiring dynamic bending, yields during fabrication and bend cycle testing are often less than 50%. The fabrication processes required for the complex components essentially preclude optimization of the dynamic bending areas on the same PCB. This leads to lower yields, reduced flex life, and other issues.

Some examples herein seek to address some of these problems by providing an FPCB with air gaps for enhanced bending flexibility and an EMI film for consistent ground reference, enabling high-speed signal transmission with controlled impedance. The FPCB may include asymmetrical dielectric thicknesses and a crosshatch pattern in the ground reference layer to further support signal integrity and mechanical durability. These and other aspects are described further below.

Figure 2A:
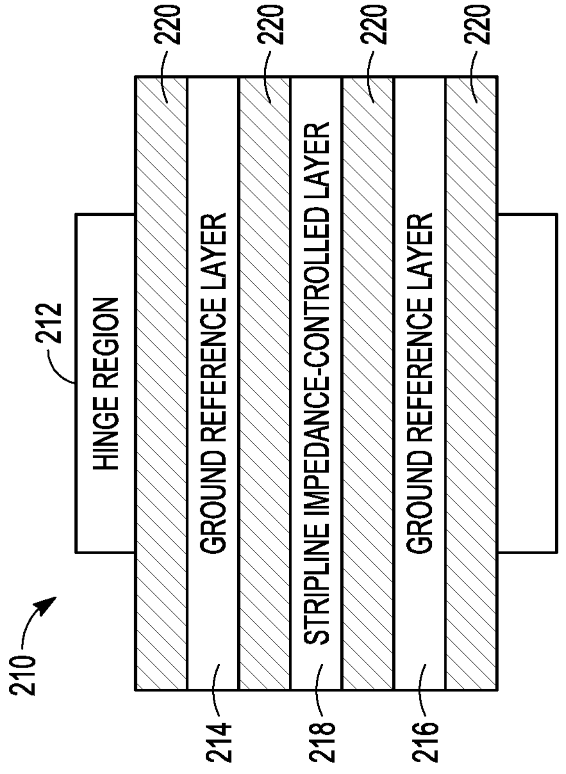
FIG. 2A (PRIOR ART)
FIG. 2A depicts an example of a conventional three-layer flexible printed circuit board (FPCB).
Figure 2B:
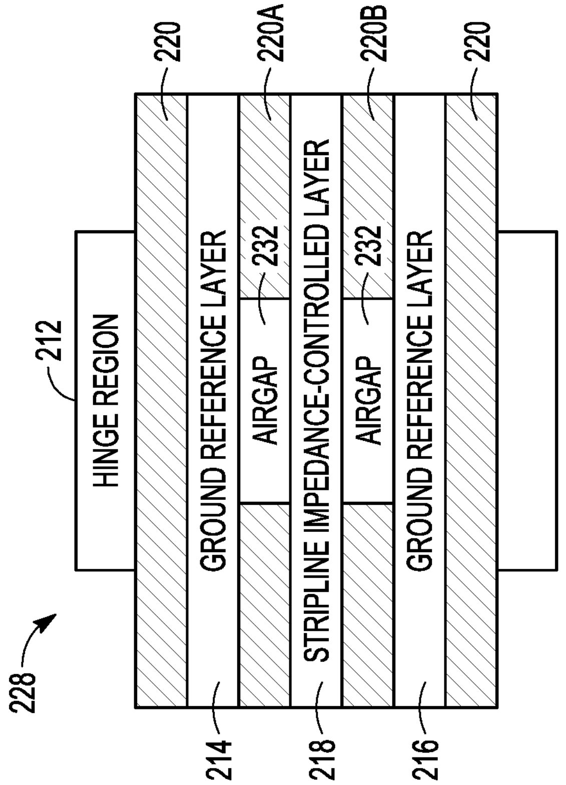
FIG. 2B (PRIOR ART)
FIG. 2B depicts another example of an alternate conventional three-layer flexible printed circuit board (FPCB).

FIG. 2A and FIG. 2B of the figures illustrate a conventional design of a prior art flexible printed circuit board (FPCB) used in the hinge region of some augmented reality (AR) eyewear. The figures depict some of the challenges that examples herein aim to address in terms of balancing the need for good bending performance with the requirement for effective stripline impedance control.

With reference to FIG. 2A, a conventional three-layer conventional FPCB 210 is shown in simplified form. A portion of the conventional FPCB 210 is located at a hinge region 212 that may comport with a flexible hinge region 146 of an AR glasses 100 described above, for example. The three layers of the conventional FPCB 210 include a first ground reference layer 214, a second ground reference layer 216, and a stripline impedance-controlled layer 218. Each layer 214, 216, 218 includes a copper material that may be insulated by a polyamide material (not shown for simplicity). One layer may be adhered to another, or covered, by a band or layer of adhesive 220 that acts as a dielectric material. In this prior art configuration, the stripline impedance-controlled layer 218 is well-supported by the consistent dielectric environment provided by the ground reference layers (214, 216) and the dielectric adhesive 220 which allows for acceptable stripline impedance control. However, this design can lack the flexibility required for the hinge region 212 as the solid construction can lead to significant stresses being imposed on the various layers of the conventional FPCB 210 during bending, thereby reducing the bending cycle-life and leading to unacceptable flex performance.

FIG. 2B shows an alternative prior art design where air gaps 232 are introduced to improve the bending performance of the air gapped FPCB 228 in the hinge region 212. In this design, two layers of the adhesive 220 (shown as 220A and 220B in the view) are not continuous, creating air gaps 232 around the stripline impedance-controlled layer 218. These air gaps 232 allow portions of each layer to move more independently with respect to one another which can significantly improve the bending cycle-life of the air gapped FPCB 228 and reduce stresses on the copper traces. However, the introduction of the air gaps 232 compromises the stripline impedance control. As discussed above, stripline impedance-controlled traces require consistent dielectric constants and thicknesses above and below it, which can be very difficult if not impossible to achieve when using air gaps. The inconsistent dielectric environment due to the presence of air gaps affects the impedance of the high-speed signals traveling through the stripline impedance-controlled layer 218. This can lead to undesirable signal integrity issues and compromised performance of AR eyewear.

Figure 3:
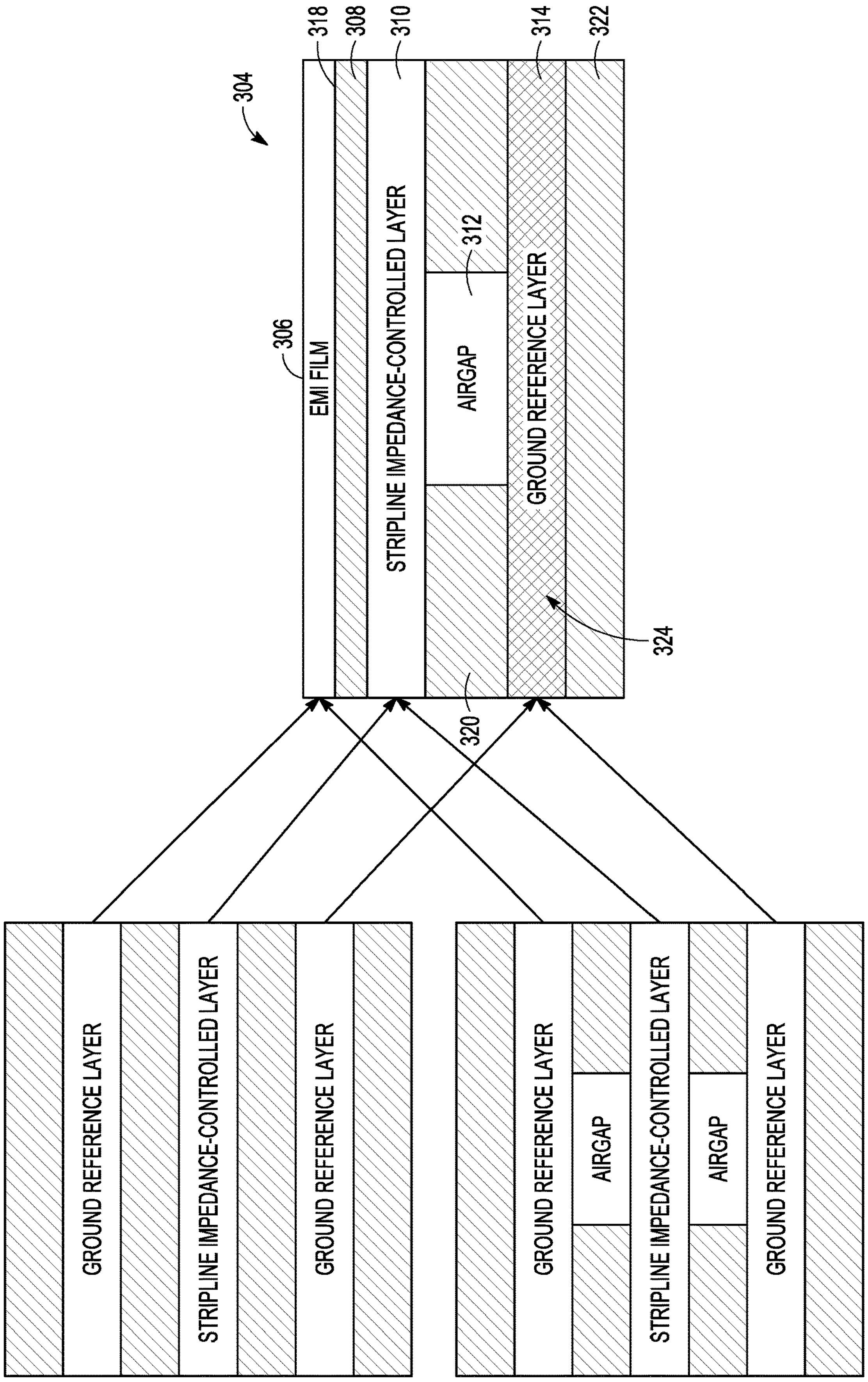
FIG. 3 illustrates a cross-sectional view of an example FPCB in accordance with one embodiment.

With reference to FIG. 3, some examples of an FPCB 304 of the present disclosure seek to address the limitations of the prior art by providing both acceptable dynamic-bend performance and acceptable stripline impedance control. To this end, some examples include an Electromagnetic Interference (EMI) film 306 to replace one of the conventional ground reference layers to maintain a consistent ground reference for the stripline impedance-controlled layer 310 while allowing for greater flexibility. Additionally, some examples employ asymmetric dielectric thicknesses and a crosshatch pattern in a second ground reference layer to further enhance bending performance without sacrificing signal integrity.

More specifically, in some examples, replacing the first ground reference layer 214 by the EMI film 306 removes one air gap without impacting dynamic bend performance. The EMI film 306 provides the stripline trace (i.e., the stripline impedance-controlled layer 310) with a consistent ground reference on one side of the stripline impedance-controlled layer 310. In some examples, the EMI film 306 is provided on one side of the stripline impedance-controlled layer 310 on an external surface 318 of the FPCB 304 where it is supported on and adhered to a layer of adhesive, such as a first adhesive layer 308 as shown. Other arrangements are possible, for example the EMI film 306 may be provided one side of the stripline impedance-controlled layer 310 on an internal surface of the FPCB 304, or on a surface of an internal layer of adhesive acting as dielectric material adjacent the stripline impedance-controlled layer 310. The layer of first adhesive layer 308 receiving or supporting the EMI film 306 may be directly adjacent the stripline impedance-controlled layer 310. In some examples, because the EMI film 306 is provided as a ground reference layer in the form of a film, this film can conveniently be applied to an external surface of the FPCB 304, for example the external surface 318, or an underside or opposite external side of the FPCB 304.

The layers of dielectric adhesive of the FPCB 304 shown in FIG. 3 include the first adhesive layer 308, a second adhesive layer 320, and a third adhesive layer 322. In some examples, the dielectric thicknesses of these adhesive layers are asymmetric on either side of the stripline impedance-controlled layer 310. In some examples, the respective dielectric thicknesses of the adhesive layers vary across the cross section of the FPCB 304 to provide desired impedance values. In some examples, a dielectric asymmetry is specially configured to promote or inhibit a given dielectric performance and provide a specific impedance for the FPCB 304.

For example, with reference to FIG. 3, the dielectric thickness of the first adhesive layer 308 is less than (i.e., is thinner) the dielectric thickness of the second adhesive layer 320. This asymmetrical dielectric thickness across the stripline impedance-controlled layer 310 (i.e., an asymmetry between the top and bottom of the stripline impedance-controlled layer 310 in the view) causes the stripline trace (i.e., the stripline impedance-controlled layer 310 acting in concert with the ground reference layers provided by EMI film 306 and ground reference layer 314) to "prefer" the top EMI layer (i.e., the EMI film 306) as an electrical path for achieving the required impedance. This preference, or "directed" or "asymmetric" impedance, can reduce reliance on the bottom layer (i.e., ground reference layer 314) where there is an air gap 312 incurring the potential impedance control problems discussed above.

Some examples further (or in the alternative) include a topography, such a crosshatch pattern 324, in a surface of the ground reference layer 314. This topography can also cause or enhance the traces of the FPCB 304 to "prefer" the top EMI film 306 for achieving the required impedance. In some examples, the provision of a topography such as a crosshatch pattern 324 (or other pattern) can improve dynamic flexibility by providing flexing points or "surface breaks" to initiate or facilitate bending.

In some examples, the FPCB 304 is characterized or configured by its modularity, for example allowing for the addition of extra layers tailored to specific functional requirements. This can include the integration of power planes and layers for low-speed signals and various configurations such as 2-layer plus EMI (2L+EMI), 3-layer plus EMI (3L+EMI), and 4-layer plus EMI (4L+EMI). This flexibility can facilitate customization to meet the diverse needs of AR eyewear applications.

Electromagnetic interference (EMI) is mitigated in some examples through the use of an EMI film. This can be effective in reducing electromagnetic emissions from high-speed signals, and for avoiding interference with other electronic devices and for driving compliance with EMI regulatory standards. In some examples, convenient properties of the EMI film of the FPCB 304 (such as the external EMI film 306) include a high electromagnetic field shielding with a low dielectric coefficient and loss factor and a robust bending cycle life. In some examples, this shielding is effective over a broad range of frequencies, providing more than 40 dB of shielding from 10 to 1000 MHz, according to the Knife-edge Equivalent Contact constraint (KEC) Method. This level of protection can help to ensure that the AR eyewear device operates reliably in various electromagnetic environments.

Additionally, in some examples, the EMI film has a low dielectric coefficient and loss factor, which can be important for maintaining signal integrity, especially at high frequencies. In some examples, the EMI film's material is designed to minimize insertion loss, with performance greater than −10 dB from 10 to 4000 MHz. This property can help to ensure that the signal transmission is not significantly attenuated as it passes through the film, which can be helpful for high-speed data communication.

In other aspects, the use of an EMI film as opposed to a traditional solid copper ground plane in the application of flexible printed circuit boards (FPCBs) for AR eyewear can be helpful or convenient. For example, EMI films are generally more flexible than solid copper layers. This increased flexibility is particularly beneficial in the hinge region of AR eyewear, where the FPCB must endure repeated bending. The EMI film can withstand these bending cycles without cracking or losing its structural integrity, thereby extending the life of the product. In some examples, the EMI film can endure more than 10,000 fold cycles with a radius of 1 millimeter (mm) when repeatedly flexed to bend through 100 degrees of movement. In some examples, this range of flexing movement may approximately correspond to an arm of an AR glasses being moved from a "closed" position where it lies against the front piece of the frame, through an open "normal wearing" position at approximately 90 degrees thereto, and on to a "hyperextension" position at 100 degrees to cater, for example, for wearers with larger heads.

The EMI film provides a consistent ground reference for the stripline impedance-controlled traces. This consistency can be helpful for maintaining the controlled impedance necessary for high-speed signal integrity. Unlike air-gapped solutions that can compromise impedance control, the EMI film maintains a uniform dielectric environment for the traces. EMI films can be thinner than solid copper ground planes, contributing to a reduction in the overall thickness and weight of the FPCB. This can be advantageous in wearable technology, where bulkiness and weight are critical factors for user comfort and design aesthetics. EMI films can be made from materials that offer a better balance between electrical performance and mechanical flexibility. For example, films can be made from conductive polymers or metalized fabrics that are lighter and more adaptable to bending than copper. In some examples, EMI films are designed to shield electronic components from electromagnetic interference. This shielding can be important in compact electronic devices like AR glasses, where different components may be in close proximity and susceptible to interference from one another.

In some examples, the application of EMI films simplifies the manufacturing process. Since films can be applied as a layer or coating, they may reduce the number of steps required to achieve both grounding and flexibility, as opposed to the more complex processes needed to create a flexible copper ground plane. EMI films can also offer better thermal management properties than traditional copper, which can be beneficial in preventing overheating in tightly packed electronic assemblies. The use of an EMI film in this application provides a balance of mechanical flexibility and electrical performance, contributing to the durability and functionality of the AR eyewear without adding unnecessary bulk or weight. It should be noted that the abovementioned material property ranges merely serve as examples and, unless cited in the claims below, should not be deemed to limit the scope of the claimed subject matter.

Figure 4:
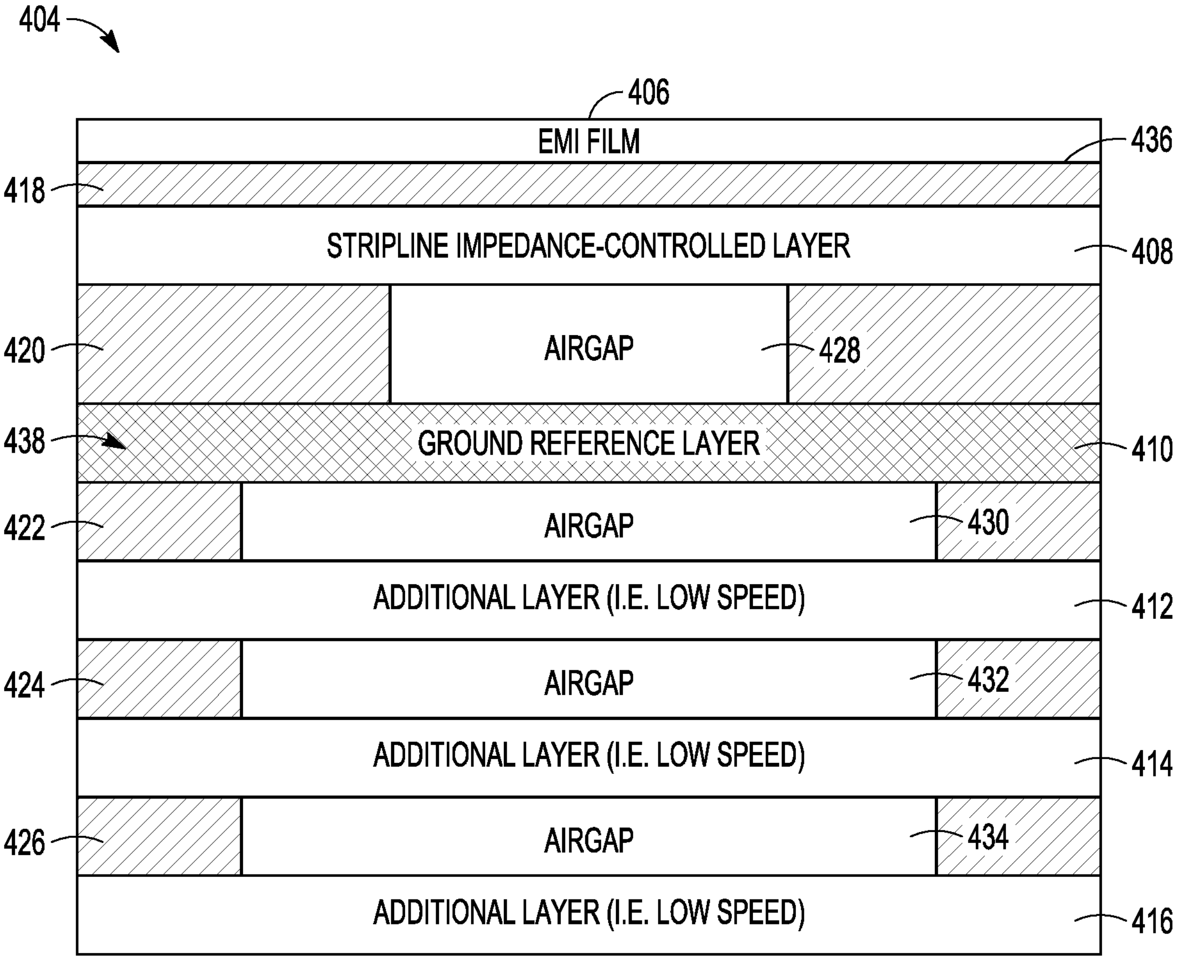
FIG. 4 illustrates a cross-sectional view of an example FPCB in accordance with another embodiment.

As mentioned above, in some examples, the FPCB is characterized or configured by its modularity, for example allowing for the addition of extra layers tailored to specific functional requirements. This can include the integration of power planes and layers for low-speed signals and various configurations. With reference to FIG. 4, an FPCB 404 includes an EMI film 406 provided on an external surface 436 thereof. The FPCB 404 includes a stripline impedance-controlled layer 408 and a ground reference layer 410. The ground reference layer 410 may include a crosshatch pattern 438. Additional layers such as a first additional low-speed layer 412, an additional power plane 414, and a second additional low-speed layer 416, are provided. These layers 406-416 can be used and deployed to configure performance attributes of the FPCB 404, such as a bending or flexibility of the FPCB 404, and/or an impedance value or attribute of the FPCB 404 and/or one or more of its traces, and/or a signal quality or signal transmission attribute of the FPCB 404 and/or one or more of its traces.

The various layers 406-416 in this illustrated example are adhered together by layers of adhesive that act as a dielectric material. For example, the adhesive layers include a first adhesive layer 418, a second adhesive layer 420, a third adhesive layer 422, a fourth adhesive layer 424, and a fifth adhesive layer 426. As shown, the first adhesive layer 418 has no air gap. A first air gap 428 is formed in the second adhesive layer 420. A second air gap 430 is formed in the third adhesive layer 422. A third air gap 432 is formed in the fourth adhesive layer 424. A fourth air gap 434 is formed in the fifth adhesive layer 426. The air gaps 430-434 are staggered (longer) with respect to the first air gap 428. Other lengths, widths, thicknesses, and offset staggering of the air gaps 428-434 are possible in other examples. This configuration and staggering of one or more of the air gaps 428-434 can be done so as to optimize for flexibility and impedance control.

In some examples of an FPCB, such as the FPCB 304 and/or the FPCB 404, an additional enhancement can be implemented to further optimize the performance of the FPCB in the hinge region of augmented reality (AR) eyewear. Specifically, a grease or gel can be dispensed into the air gaps between the layers of the FPCB. This grease or gel serves multiple purposes, each contributing to the overall functionality and longevity of the FPCB.

In some examples, the grease or gel acts as a lubricant for the individual layers of the FPCB. By reducing friction during bending and flexing motions, the lubricant facilitates smoother movement, thereby improving the cycle life of the FPCB. This can be beneficial in the hinge region, where repeated motion can cause wear and tear over time. In some examples, the presence of the grease or gel in the air gaps helps to maintain the layers in closer proximity. This proximity aids in providing a more consistent impedance control across the FPCB. By minimizing the variability in the dielectric environment around the stripline impedance-controlled traces, the grease or gel helps to ensure that the high-speed signals are transmitted with reliable impedance characteristics. In some examples, the grease or gel can be formulated with dielectric materials that help to reduce electromagnetic (EM) emissions emanating from the air gap holes. The dielectric properties of the grease or gel can attenuate EM emissions, contributing to the overall electromagnetic compatibility (EMC) of the device. In some examples, the introduction of the grease or gel into the air gaps can lead to an improvement in insertion loss. The dielectric properties of the grease or gel can enhance the signal integrity by reducing the loss of signal power as it travels through the FPCB. This results in more efficient signal transmission and can be particularly advantageous for maintaining the performance of high-speed data lines. In some examples, the provision of a grease or gel into the air gaps of the FPCB enhances the mechanical and electrical performance of the FPCB in applications where both good flexibility and signal integrity are desired. In some examples, the provision of a grease or gel into the air gaps of the FPCB can prevent collapse of the air gap and short circuit of the layers either side of the air gap.

Figure 5:
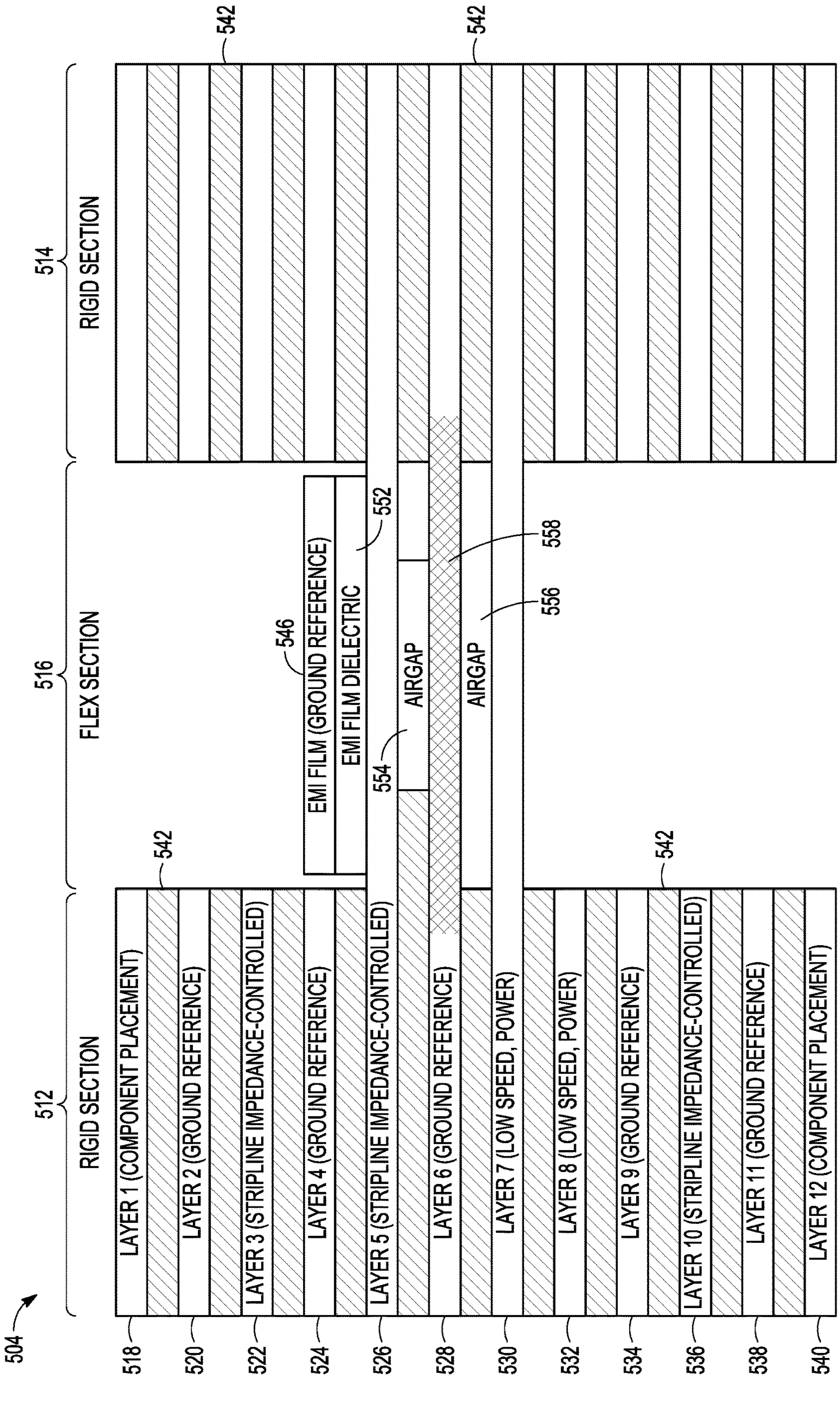
FIG. 5 illustrates a cross-sectional view of an example FPCB in accordance with another embodiment.

With reference to FIG. 5, an FPCB 504 includes a first rigid section 512, a second rigid section 514, and a flexible section 516 between the first rigid section 512 and the second rigid section 514. The flexible section 516 may correspond with a hinge region 146 of the AR glasses 100 of FIG. 1, for example.

Within the first rigid section 512, a number of example layers or traces are provided. Other layers and layer configurations are possible. The layers or traces may include, by way of example, a Layer 1 (component placement) 518, a Layer 2 (ground reference) 520, a Layer 3 (stripline impedance-controlled) 522, a Layer 4 (ground reference) 524, a Layer 5 (stripline impedance-controlled) 526, a Layer 6 (ground reference) 528, a Layer 7 (low speed, power) 530, a Layer 8 (low speed, power) 532, a Layer 9 (ground reference) 534, a Layer 10 (stripline impedance-controlled) 536, a Layer 11 (ground reference) 538, and a Layer 12 (component placement) 540. The same, or different, layers or traces may be provided in the second rigid section 514. As illustrated, the Layer 5 (stripline impedance-controlled) 526, the Layer 6 (ground reference) 528, and the Layer 7 (low speed, power) 530 extend across the flexible section 516 (or hinge region 146 of the AR glasses 100) and into the second rigid section 514.

Adjacent each layer or trace in the first rigid section 512 and the second rigid section 514, a layer of dielectric material 542 is provided, as shown. Other arrangements or layers of dielectric material 542 are possible. A layer of dielectric material 542 may be formed or introduced as part of a fabrication process of the FPCB 504. Each of the layers of dielectric material 542 may be composed of or include one or more dielectric materials such as an adhesive material, a polyimide, a polyamide, a pre-impregnated (prepreg) material, or other suitable dielectric material. In some examples, these dielectric layers are integral to the FPCB's structure, providing electrical insulation and contributing to the overall mechanical stability of the board.

In the flexible section 516, the FPCB 504 includes an EMI film 546 as a ground reference and, in this case, an EMI film dielectric 552 that are disposed on an upper side of the Layer 10 (stripline impedance-controlled) 536 in the view. The flexible section 516 further comprises a portion of the Layer 6 (ground reference) 528 and the Layer 7 (low speed, power) 530, as shown. A first air gap 554 is provided in the dielectric material 542 underlying the Layer 5 (stripline impedance-controlled) 526 in the flexible section 516, and a second air gap 556 is provided in the dielectric material 542 located above the Layer 7 (low speed, power) 530 in the flexible section 516.

As shown, in some examples, the first air gap 554 is shorter in length than the second air gap 556, or has a staggered start and/or a staggered end. The shorter length, or staggered start and end, of the first air gap 554 may serve to indicate that this region or layer of the FPCB 504 is optimized for bending, impedance control, and/or signal quality performance. Further, as shown, the Layer 6 (ground reference) 528 may include a crosshatch pattern 558 in the region of the flexible section 516.

The depicted flexible printed circuit board FPCB 504 of FIG. 5 is designed in some examples to integrate seamlessly into flexible regions of augmented reality (AR) glasses 100, as indicated for example by the hinge region 146 in FIG. 1. As mentioned, the FPCB 504 is composed of a first rigid section 512 and a second rigid section 514, with a flexible section 516 situated between them. This flexible section 516 is of note as it aligns with the hinge region of the AR glasses, allowing for the required flexibility while maintaining electrical connectivity.

The series of layers or traces can serve various functions within the FPCB 504. These include Layer 1 (component placement) 518, which is typically the outermost layer where electronic components are mounted. The ground reference layers, namely Layer 2 (ground reference) 520, Layer 4 (ground reference) 524, Layer 6 (ground reference) 528, Layer 9 (ground reference) 534, and Layer 11 (ground reference) 538 provide a stable ground reference for the circuit. The stripline impedance-controlled layers, namely Layer 3 (stripline impedance-controlled) 522, Layer 5 (stripline impedance-controlled) 526, and Layer 10 (stripline impedance-controlled) 536, are of note for maintaining the integrity of high-speed signals. The low-speed and power layers, namely Layer 7 (low speed, power) 530 and Layer 8 (low speed, power) 532 carry lower-speed signals and power distribution across the FPCB 504. Layer 12 (component placement) 540 is another component placement layer, mirroring Layer 1 (component placement) 518. The second rigid section 514 may contain the same or different layers or traces as needed for the specific application.

As noted above, each of these layers is separated by a layer of dielectric material 542, which can be composed of various substances or materials such as adhesive materials, polyimide, polyamide, prepreg materials, or other suitable dielectric materials. These dielectric layers are integral to the FPCB's structure, providing electrical insulation and contributing to the overall mechanical stability of the board.

In the flexible section 516, the FPCB 504 incorporates the EMI film (ground reference) 546 on the upper side of Layer 10 (stripline impedance-controlled) 536. The EMI film dielectric 552, which in some examples is part of the EMI film, provides a consistent ground reference for the adjacent stripline layer, i.e., Layer 5 (stripline impedance-controlled) 526 and contributes to the FPCB's flexibility. The EMI film (ground reference) 546 is of note for maintaining signal integrity during the bending and flexing of the FPCB 504 within the hinge region.

As noted above, the flexible section 516 also includes portions of Layer 6 (ground reference) 528 and Layer 7 (low speed, power) 530. The introduction of air gaps, such as the first air gap 554 beneath Layer 5 (stripline impedance-controlled) 526 and the second air gap 556 above Layer 7 (low speed, power) 530, serves several purposes. These air gaps allow for enhanced flexibility by reducing the material that would otherwise resist bending. Additionally, the staggered start or varied length of these air gaps can be configured to optimize the FPCB for bending, impedance control, and signal quality performance.

The crosshatch pattern 558 within Layer 6 (ground reference) 528 in the flexible section 516 can, in some examples, increase the flexibility of this ground layer and reduce the likelihood of cracking under repeated flexing. It also contributes to the impedance control by altering the current return path, which can be beneficial for signal integrity.

Figure 6:
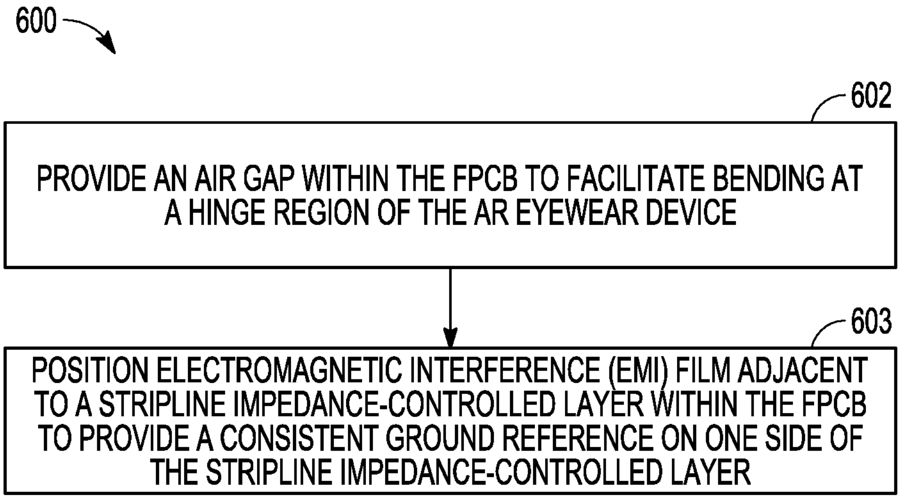
FIG. 6 illustrates a method for manufacturing a flexible printed circuit board (FPCB) for an augmented reality (AR) eyewear device in accordance with one embodiment.

Some examples include method embodiments. FIG. 6 is a flowchart illustrating a method 600, according to some example embodiments, for manufacturing a flexible printed circuit board (FPCB) for an augmented reality (AR) eyewear device. Although the flow diagram and operations described below can flow as a sequential process, many of the operations can be performed in parallel or concurrently. In addition, the order of the operations may be re-arranged. A process is terminated when its operations are completed. A process may correspond to a method, a procedure, an algorithm, etc. The operations of methods may be performed in whole or in part in conjunction with some or all of the operations in other methods, and may be performed by any number of different systems.

In operation 602, method 600 provides an air gap within the FPCB to facilitate bending at a hinge region of the AR eyewear device. In operation 604, method 600 positions an Electromagnetic Interference (EMI) film adjacent to a stripline impedance-controlled layer within the FPCB to provide a consistent ground reference on one side of the stripline impedance-controlled layer.

The method 600 may further include configuring the FPCB with asymmetrical dielectric thicknesses above and below the stripline impedance-controlled layer to facilitate high-speed signal transmission. The method 600 may further include applying a second ground reference layer within the FPCB. In some examples of the method 600, the second ground reference layer is applied with a crosshatch pattern to improve dynamic flexibility and to maintain impedance control of the stripline impedance-controlled layer. In some examples, the method 600 further includes adding additional layers to the FPCB to support other functions, where the additional layers include at least one of power planes and low-speed signal layers. In some examples of the method 600, airgaps in the additional layers are staggered for flexibility and impedance control.

In some examples of the method 600, the EMI film is selected to reduce electromagnetic interference emissions from high-speed signals. In some examples of the method 600, the air gap is positioned to correspond with a bending axis of the hinge region. In some examples of the method 600, the stripline impedance-controlled layer is configured to support signals with a frequency above a predetermined threshold. In some examples, the method 600 further includes including the FPCB in the AR eyewear device. In some examples, the method 600 further includes providing a lubricating substance within the airgap of the FPCB.

EXAMPLES

Thus, some embodiments may include one or more of the following examples.

Example 1. An apparatus comprising a flexible printed circuit board (FPCB) configured to be positioned at a hinge region of an augmented reality (AR) eyewear device; an air gap within the FPCB to facilitate bending at the hinge region; and an Electromagnetic Interference (EMI) film positioned adjacent to a stripline impedance-controlled layer within the FPCB, the EMI film providing a consistent ground reference on one side of the stripline impedance-controlled layer.

Example 2. The apparatus of example 1, wherein the FPCB comprises asymmetrical dielectric thicknesses above and below the stripline impedance-controlled layer to preferentially direct high-speed signals towards the EMI film.

Example 3. The apparatus of example 1 or example 2, further comprising a second ground reference layer.

Example 4. The apparatus of example 3, wherein the second ground reference layer includes a crosshatch pattern to improve dynamic flexibility and to maintain impedance control of the stripline impedance-controlled layer.

Example 5. The apparatus of any one of examples 1-4, wherein the FPCB is configured to support additional layers for power planes and low-speed signal layers.

Example 6. The apparatus of example 5, wherein the additional layers are staggered for flexibility and impedance control.

Example 7. The apparatus of any one of examples 1-6, wherein the EMI film is configured to reduce electromagnetic interference emissions from high-speed signals.

Example 8. The apparatus of example 7, wherein the EMI film provides more than 40 dB of shielding from 10 to 1000 MHz and maintains signal integrity with an insertion loss greater than −10 dB from 10 to 4000 MHz.

Example 9. The apparatus of any one of examples 1-8, wherein the EMI film is capable of enduring more than 10,000 fold cycles with a radius of 1 millimeter (mm) when repeatedly flexed to bend through 100 degrees of movement.

Example 10. The apparatus of any one of examples 1-9, wherein the air gap is positioned to correspond with a bending axis of the hinge region.

Example 11. The apparatus of any one of examples 1-10, wherein the stripline impedance-controlled layer is configured to support signals with a frequency above a predetermined threshold.

Example 12. The apparatus of any one of examples 1-11, wherein the FPCB is included in the AR eyewear device.

Example 13. The apparatus of any one of examples 1-12, further comprising a lubricating substance dispensed within the air gaps to reduce friction between the layers and improve a bending cycle life of the FPCB.

Example 14. The apparatus of example 13, wherein the lubricating substance includes a grease or gel formulated with dielectric materials to provide consistent impedance control and reduce electromagnetic emissions from the air gaps.

Example 15. The apparatus of example 14, wherein the dielectric materials within the grease or gel contribute to an improvement in insertion loss for high-speed signals transmitted through the FPCB.

Example 16. A method for manufacturing a flexible printed circuit board (FPCB) for an augmented reality (AR) eyewear device, the method comprising providing an air gap within the FPCB to facilitate bending at a hinge region of the AR eyewear device; and positioning an Electromagnetic Interference (EMI) film adjacent to a stripline impedance-controlled layer within the FPCB to provide a consistent ground reference on one side of the stripline impedance-controlled layer.

Example 17. The method of example 16, further comprising configuring the FPCB with asymmetrical dielectric thicknesses above and below the stripline impedance-controlled layer to facilitate high-speed signal transmission.

Example 18. The method of example 16 or example 17, further comprising applying a second ground reference layer within the FPCB.

Example 19. The method of example 18, wherein the second ground reference layer is applied with a crosshatch pattern to improve dynamic flexibility and to maintain impedance control of the stripline impedance-controlled layer.

Example 20. The method of any one of examples 16-19, further comprising adding additional layers to the FPCB to support other functions, wherein the additional layers include at least one of power planes and low-speed signal layers.

Example 21. The method of example 20, wherein air gaps in the additional layers are staggered for flexibility and impedance control.

Example 22. The method of any one of examples 16-21, wherein the EMI film is selected to reduce electromagnetic interference emissions from high-speed signals.

Example 23. The method of any one of examples 16-22, wherein the air gap is positioned to correspond with a bending axis of the hinge region.

Example 24. The method of any one of examples 16-23, wherein the stripline impedance-controlled layer is configured to support signals with a frequency above a predetermined threshold.

Example 25. The method of any one of examples 16-24, further comprising including the FPCB in the AR eyewear device.

Example 26. The method of any one of examples 16-25, further comprising providing a lubricating substance within the air gap of the FPCB.

Example 27. An augmented reality (AR) eyewear device comprising a frame with at least one hinge region; a flexible printed circuit board (FPCB) positioned at the at least one hinge region, the FPCB including an air gap to facilitate bending and an Electromagnetic Interference (EMI) film adjacent to a stripline impedance-controlled layer to provide a consistent ground reference on one side; a display system integrated with the frame for presenting AR content to a user; a power source connected to the display system and the FPCB to provide electrical power; and a processing unit configured to control the display system and process the AR content.

The various operations of example methods described herein may be performed, at least partially, with the assistance of one or more hardware processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more hardware processors. Similarly, the methods described herein may be at least partially processor-implemented, with a particular processor or processors being an example of hardware. For example, at least some of the operations of a method may be performed by one or more hardware processors or processor-implemented components.

While the above is a complete description of the example embodiments of the inventive subject matter, various alternatives, modifications, and equivalents may be used. Therefore, the above description should not be taken as limiting the scope of the inventive subject matter which is defined by the appended claims.

The invention claimed is:

1. An apparatus comprising:

a flexible printed circuit board (FPCB) configured to be positioned at a hinge region of an augmented reality (AR) eyewear device;

an air gap within the FPCB to facilitate bending at the hinge region; and an Electromagnetic Interference (EMI) film laminated onto the FPCB and positioned adjacent to a stripline impedance-controlled layer within the FPCB, the EMI film providing a consistent first ground reference on a first side of the stripline impedance-controlled layer; and a second ground reference layer providing a consistent second ground reference on an opposing second side of the stripline impedance-controlled layer, wherein the stripline impedance-controlled layer is sandwiched between the EMI film and the second ground reference layer to form a stripline transmission structure within the FPCB.

2. The apparatus of claim 1, wherein the FPCB comprises asymmetrical dielectric thicknesses above and below the stripline impedance-controlled layer to preferentially direct high-speed signals towards the EMI film.

3. The apparatus of claim 1, wherein the second ground layer comprises a patterned second ground reference layer.

4. The apparatus of claim 3, wherein the second ground reference layer includes a crosshatch pattern to improve dynamic flexibility and to maintain impedance control of the stripline impedance-controlled layer.

5. The apparatus of claim 1, wherein the FPCB is configured to support additional layers for power planes and low-speed signal layers.

6. The apparatus of claim 5, wherein the additional layers include air gaps that are longitudinally offset from one another along a length of the FPCB such that bending stress is distributed across multiple positions along the FPCB, and impedance continuity is maintained at each cross-section of the hinge region.

7. The apparatus of claim 1, wherein the EMI film is configured to reduce electromagnetic interference emissions from high-speed signals.

8. The apparatus of claim 7, wherein the EMI film provides more than 40 dB of shielding from 10 to 1000 MHz and maintains signal integrity with an insertion loss greater than −10 dB from 10 to 4000 MHz.

9. The apparatus of claim 1, wherein the EMI film is capable of enduring more than 10,000 fold cycles with a radius of 1 millimeter (mm) when repeatedly flexed to bend through 100 degrees of movement.

10. The apparatus of claim 1, wherein the air gap is positioned to correspond with a bending axis of the hinge region.

11. The apparatus of claim 1, wherein the stripline impedance-controlled layer is configured to support signals with a frequency above a predetermined threshold.

12. The apparatus of claim 1, wherein the FPCB is included in the AR eyewear device.

13. The apparatus of claim 1, further comprising a flowable lubricating substance dispensed within the air gaps to reduce friction between the layers and improve a bending cycle life of the FPCB.

14. The apparatus of claim 13, wherein the lubricating substance includes a grease or gel formulated with dielectric materials to provide consistent impedance control and reduce electromagnetic emissions from the air gaps.

15. The apparatus of claim 14, wherein the dielectric materials within the grease or gel have a dielectric constant selected to reduce impedance mismatch at a boundary between the air gap and surrounding FPCB layers, thereby improving insertion loss for high-speed signals transmitted through the FPCB.

16. A method for manufacturing a flexible printed circuit board (FPCB) for an augmented reality (AR) eyewear device, the method comprising:

providing an air gap within the FPCB to facilitate bending at a hinge region of the AR eyewear device; and positioning an Electromagnetic Interference (EMI) film adjacent to a stripline impedance-controlled layer within the FPCB to provide a consistent ground reference on one side of the stripline impedance-controlled layer.

17. The method of claim 16, further comprising configuring the FPCB with asymmetrical dielectric thicknesses above and below the stripline impedance-controlled layer to facilitate high-speed signal transmission.

18. The method of claim 16, further comprising a second ground layer, wherein the second ground layer comprises a patterned second ground reference layer.

19. The method of claim 18, wherein the second ground reference layer is applied with a crosshatch pattern to improve dynamic flexibility and to maintain impedance control of the stripline impedance-controlled layer.

20. The method of claim 16, further comprising adding additional layers to the FPCB to support other functions, wherein the additional layers include at least one of power planes and low-speed signal layers.

21. The method of claim 20, wherein air gaps in the additional layers are longitudinally offset from one another along a length of the FPCB such that bending stress is distributed across multiple positions along the FPCB, and impedance continuity is maintained at each cross-section of the hinge region.

22. The method of claim 16, wherein the EMI film is selected to reduce electromagnetic interference emissions from high-speed signals.

23. The method of claim 16, wherein the air gap is positioned to correspond with a bending axis of the hinge region.

24. The method of claim 16, wherein the stripline impedance-controlled layer is configured to support signals with a frequency above a predetermined threshold.

25. The method of claim 16, further comprising including the FPCB in the AR eyewear device.

26. The method of claim 16, further comprising providing a lubricating substance within the air gap of the FPCB.

27. An augmented reality (AR) eyewear device comprising:

a frame with at least one hinge region;

a flexible printed circuit board (FPCB) positioned at the at least one hinge region, the FPCB including an air gap to facilitate bending and an Electromagnetic Interference (EMI) film laminated onto the FPCB and adjacent to a stripline impedance-controlled layer to provide a consistent first ground reference on a first side of the stripline impedance-controlled layer, and a second ground reference layer providing a consistent second ground reference on an opposing second side of the stripline impedance-controlled layer, wherein the stripline impedance-controlled layer is sandwiched between the EMI film and the second ground reference layer to form a stripline transmission structure within the FPCB;

a display system integrated with the frame for presenting AR content to a user;

a power source connected to the display system and the FPCB to provide electrical power; and a processing unit configured to control the display system and process the AR content.

* * * * *